(12) United States Patent
Jammula et al.

(10) Patent No.: US 7,818,135 B2
(45) Date of Patent: Oct. 19, 2010

(54) OPTIMUM TIMING OF WRITE AND READ CLOCK PATHS

(75) Inventors: Ravi Kishore Jammula, King of Prussia, PA (US); Andrew Wang, Wescosville, PA (US); Mark Thierbach, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 278 days.

(21) Appl. No.: 12/129,882

(22) Filed: May 30, 2008

(65) Prior Publication Data
US 2009/0295438 A1 Dec. 3, 2009

(51) Int. Cl.
G06F 19/00 (2006.01)
(52) U.S. Cl. .................................... 702/89
(58) Field of Classification Search ............ 702/89, 702/117, 118, 182–185
See application file for complete search history.

(56) References Cited

U.S. PATENT DOCUMENTS

| | | | |
|---|---|---|---|
| 5,396,463 A | 3/1995 | Kim et al. | |
| 5,742,185 A | 4/1998 | Lee | |
| 6,959,256 B2 | 10/2005 | Basto | |
| 7,005,875 B1 | 2/2006 | Natarajan et al. | |
| 2010/0064074 A1* | 3/2010 | Hansquine et al. | 710/61 |

* cited by examiner

Primary Examiner—Edward Raymond
(74) Attorney, Agent, or Firm—Mendelsohn, Drucker & Associates, P.C.; Steve Mendelsohn

(57) ABSTRACT

An apparatus and method for timing calibration of write and read-back data exchanges between respective dies of an external memory/external device has a master arbiter or, alternatively, a test bus between a system bus master interface and an external memory controller for driving the external memory/external device, a calibration circuit under control of the master arbiter via a test bus master interface to provide stepped-through time delays for test data exchanges between the dies, and the calibration circuit obtains pass/fail data indicating pass or fail of the varied time delays for the test data exchanges. A processor system at the system bus master interface selects calibration values corresponding to pass data, and applies the calibration values to the respective dies for timing of write and read-back data exchanges between the dies.

19 Claims, 6 Drawing Sheets

OPTIMUM TIMING OF WRITE AND READ CLOCK PATHS

FIELD OF THE INVENTION

The invention relates to automated calibration routines for clock timing of read and write addressing functions.

BACKGROUND

According to U.S. Pat. No. 6,556,934, signal propagation times TA1, TA2, TA3 . . . of respective pin selection paths of a pin selection device that selectively connects output pins of a semiconductor device testing apparatus to a timing measurement device are measured in advance, and the measured values are memorized. At the time of timing calibration, calibration pulses are transmitted to a timing calibrators via respective test pattern signal transmission paths and respective pin selection paths to measure delay time values T1, T2, T3, - - - of respective channels, The known values TA1, TA2, TA3 , - - - are subtracted from the measured values T1, T2, T3, - - - , respectively. A timing calibration is performed by adjusting delay time values of the timing calibrators of the respective test pattern signal transmission paths such that each of the respective differences between the TA1, TA2, TA3, - - - and the measured values T1, T2, T3, - - - become a constant value TC.

Testing the clock timing of read and/or write addressing functions of a memory module is useful to determine if the timing settings need to be retimed to assure the device being tested is in an operational mode with no failure in clock timing. Previous solutions for retiming have included: switchable timing paths of different time domains, which are either hardwire or printed circuits external to the memory module, or redundant input/output pins on a clock or on a memory for switchable selection of such pins to select different timing paths in the clock or in the memory. Alternatively, retiming has been provided by digital phase lock loop (DPLL) feedback controls to retime the address functions and eliminate time domain drift. Such retiming solutions are inefficient for consuming high operating power and semiconductor real estate, and at times has required manufacturing retooling of the semiconductor devices.

Retiming of the read and/or write addressing functions is desirable to obtain optimum timing performance for each clock path. Further, a tuning operation is desirable to shift the retimed performance to the center of a range of permissible performances. Without such tuning, even a slight shift in timing performance (which may be caused by semiconductor processing, ambient atmospheric and applied voltage disturbances) would shift the performance outside of a permissible range, and thereby cause a timing performance failure.

SUMMARY OF THE INVENTION

The invention was developed to provide calibration and retiming of clock data exchanges and read-back data exchanges between one or more dies of an external memory/external device.

Embodiments of the invention provide a calibration circuit, either for external connection to a system-to-device interface, or for circuit integration with a system-to-device interface.

Embodiments of the invention provide retiming of clock data exchanges, write data exchanges and read-back data exchanges to the center or midpoint of a range of timing delays that correspond to successful data exchanges, as determined by a stepped-through set of known, sequenced time delays for simulated write and read transactions and a data integrity check indicating successful data exchanges.

Selecting calibration values that occur within a range of pass values compensates for a loss of pass values due to operational drift in the equipment and/or external environmental changes including, but not limited to atmospheric conditions or RF interference. This will allow the memory access to work reliably during systems operation even when variations of device operating conditions including silicon temperature impacted by operating clock speed, power consumption, voltage drop on both driving and receiving sides, ambient temperature and applied voltage variations vary the range of the timing window after calibration has been performed. Embodiments of the invention provide timing calibration of the data exchanges with no incidence of failure.

DETAILED DESCRIPTION

Figure 1:
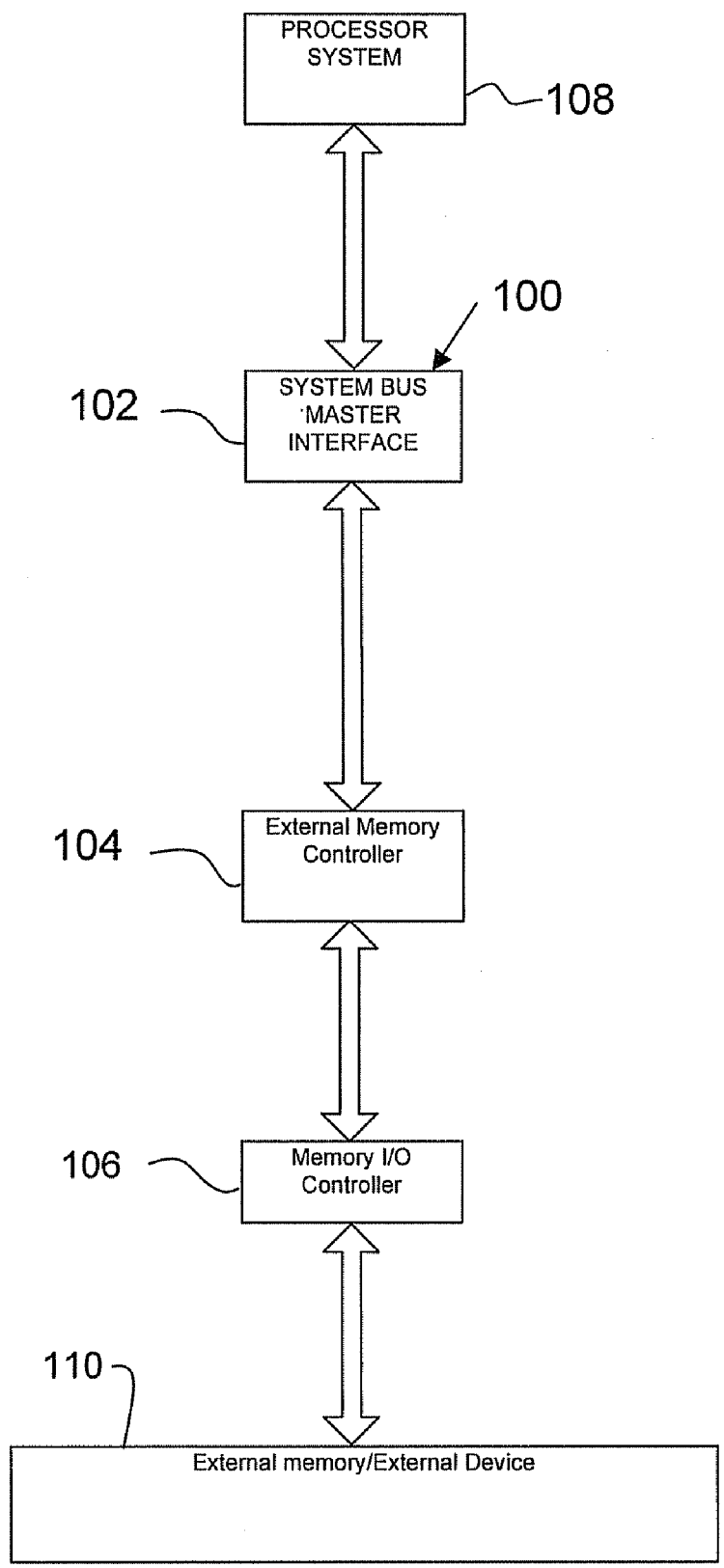
FIG. 1 is a diagram of a system bus to an external memory/external device interface for a processor system to drive an external memory/external device, which includes, but is not limited to multiple external memory controllers and external devices, such as, SRAM and SDRAM controllers for stacked arrays of memory devices of different sizes.

FIG. 1 discloses a processor system to device interface apparatus 100 including a system bus master interface 102, an external memory controller 104 and a memory I/O interface 106, which are interconnected for two way communications exchange, as depicted by bidirectional arrows in FIG. 1. Similarly, bidirectional arrows appear in respective drawing figures to depict interconnections for two way communications. The interface 100 is referred to herein as a system-to-device interface 100, for a processor system 108 to drive an external memory/external device 110 at the memory I/O interface 106, via the external memory controller 104. FIG. 1 discloses the processor system 108 driving the external memory/external device 110 during normal systems operation.

The invention was developed to provide retiming of clock data exchanges, write data exchanges and read-back data exchanges with one or more dies of the external memory/external device 110. Some embodiments of the invention provide a calibration circuit for external connection to a system-to-device interface, or alternatively, for circuit integration with a system-to-device interface. Some embodiments of the invention provide timing calibration of the data exchanges with no incidence of failure. Some embodiments of the invention provide calibration for timing of clock, write and read-back data exchanges between dies without incidence of failure. Some embodiments of the invention provide retiming of clock data exchanges and read-back data exchanges to the center of a range of successful timing delays determined by stepping through a known sequence of timing delays to obtain a range of successful timing delays indicated by the test data as corresponding to passing data exchanges.

The external memory/external device 110 may include, but is not limited to one or more semiconductor dies susceptible to timing issues, for which such timing issues adversely affect passing of communications (data or clock) between the semiconductor dies. For example, such timing issues can adversely alter the successful exchanges of clock and write-and-read-back communications among the separate dies. Some embodiments of the invention operate to calibrate the timing delays of write data and read-back data, which assure that the timing of write-and-read-back communications pass between dies without a single failure. Further embodiments of the invention operate to calibrate the timing delays of the write-and-read-back communications. Further embodiments of the invention incorporate a calibration circuit in the system bus-to-device interface 100.

Figure 2A:
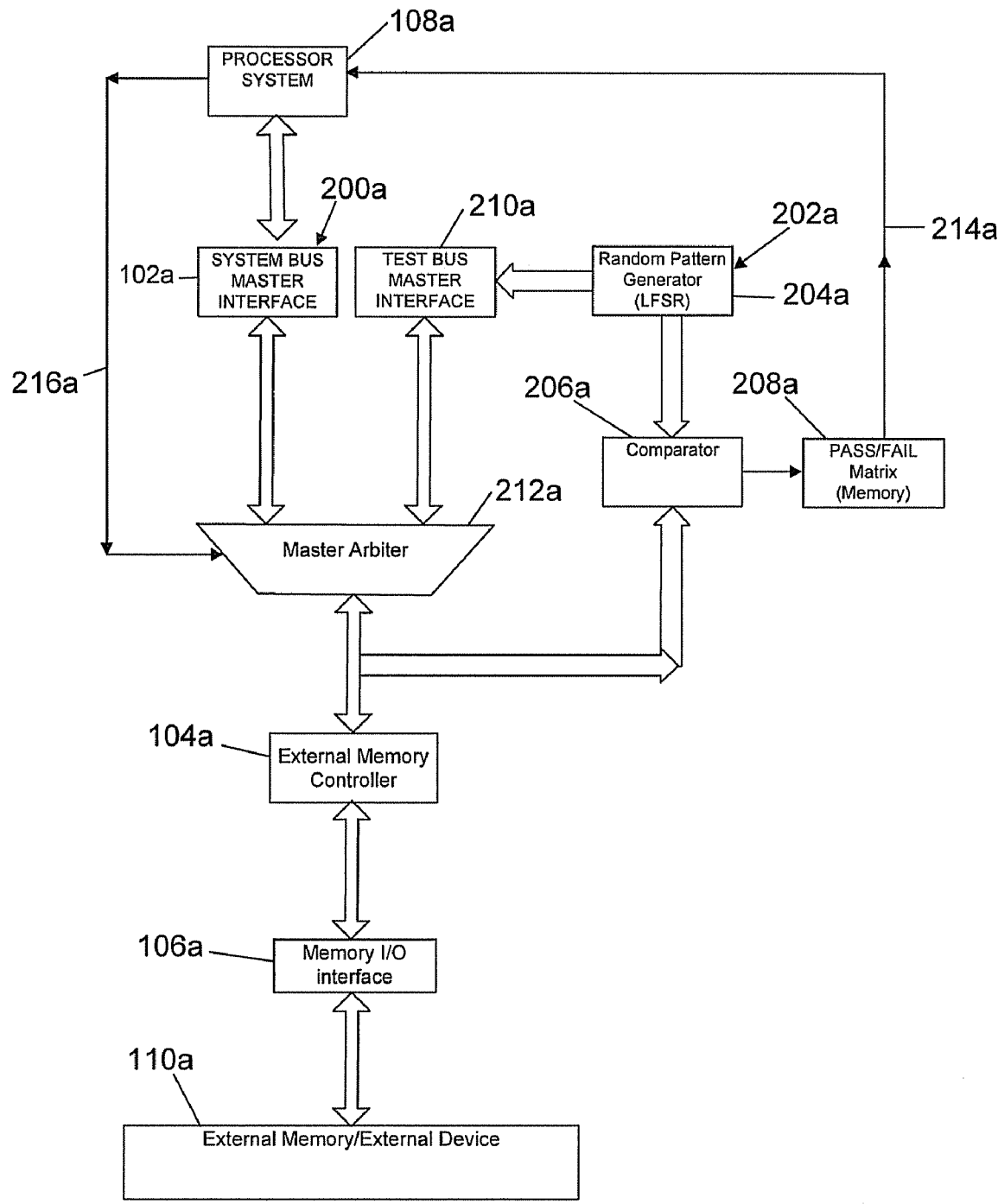
FIG. 2A is a diagram of a variation of the interface of FIG. 1 having a master arbiter and a calibration circuit for calibrating write and/or read-back clock and data exchanges between dies of an external memory/external device.

FIG. 2A discloses a variation of an interface, a processor system-to-device interface apparatus, indicated at 200a. The interface 200a includes a master arbiter 212a that interfaces with a system bus master interface 102a. The interface 200a is similar to the interface 100 disclosed in FIG. 1, by having a processor controlled, processor system 108a that drives an external memory/external device 110a at the memory I/O interface 106a under control of the master arbiter 212a. Further, the interface 200a incorporates a calibration circuit 202a interfacing with a test bus master interface 210a.

In FIG. 2A, the master arbiter 212a interfaces with the calibration circuit 202a via the test bus master interface 210a, and runs a test data algorithm of the processor system 108a, by which the calibration circuit 202a generates stepped time delays that are sequentially stepped-through to generate random test data, and transmits the test data to the external memory/external device 110a at the memory I/O interface 106a. Stepped through time delays are provided to simulated write and read or read-back test communications to determine which of the time delays correspond to test communications passing, or failing to pass, between the dies of the external memory/external device 110a. Test data indicating passing, or failing to pass, are obtained. Operation of the calibration circuit 202a will now be described.

In FIG. 2A, the calibration circuit 202a includes a random pattern generator that can include a (LSFR) 204a, a comparator 206a and a pass/fail matrix memory 208a. The LSFR 204a generates the stepped through time delays to obtain the test data, and transmits the test data to the external memory/external device 110a, via the test bus master interface 210a and under control of the master arbiter 212a. Further, the LFSR 204a transmits a duplicated set of the test data to the comparator 206a, and is reset after successful transmission of the test data.

The test data provide pass, or fail to pass, indications for simulated write and read-back communications in the clock paths between the dies of the external memory/external device 110a. The multiplexed time delays result in, either successful simulated communication exchanges (pass data), or unsuccessful simulated communication exchanges (fail data) among the dies. The pass/fail data are obtained for each of the respective dies of the external memory/external device 110a. The master arbiter 212a retrieves the pass/fail data output from the external memory controller 104a, and transmits the pass/fail data to the comparator 206a via the test bus master interface 210a, to match the pass/fail data with the corresponding test data that were duplicated and transmitted by the LSFR 204a to the comparator 206. The pass/fail data that are matched with corresponding test data are output from the comparator 206 for storage in the pass/fail matrix memory 208.

With further reference to FIG. 2A, the processor system 108a retrieves the stored data (the pass/fail data matched with corresponding test data) from the pass/fail matrix memory 208a. The retrieved data is routed over the communications line 214a from the pass/fail matrix memory 208a. The processor system 108a applies an analysis algorithm to the retrieved data to identify the timing delays that correspond solely to pass data that are present in the pass/fail data.

Moreover, the analysis algorithm applies a selection formula that selects calibration values from such timing delays that correspond to the pass data. The processor system 108a outputs the calibration values over the transmission line 216a to the master arbiter 212a, Alternatively, the processor system 108a can output the calibration values via the system bus master interface 102a to the master arbiter 212a. The master arbiter 212a calibrates the dies of the external memory/external device 110a with the calibration values, for successful transmission of write and read-back communications to be exchanged between the dies during normal system operation.

Advantageously, selecting calibration values that occur within a range of pass values compensates for a loss of pass values due to operational drift in the equipment and/or external environmental changes including, but not limited to atmospheric conditions and applied voltage. This will allow the memory access to work reliably even when operating parameters such as ambient temperature and applied voltage vary the range of the timing window after calibration has been performed. The analysis algorithm can be set to determine a range of pass values, and to select a calibration value that corresponds to any pass value in the range. Most preferably, the analysis algorithm can be set to determine a range of pass values, and to select a calibration value occurring substantially at a midpoint range of the pass values. For another embodiment of the invention, the analysis algorithm can be set to select calibration values that correspond to any of the pass data in the pass/fail data.

In FIG. 2A, embodiments of the processor system 108 operate with a system clock rate suitable for voice and/or data transmission. The master arbiter 212a can run the calibration test at a lower clock rate concurrently with normal systems operation of the apparatus by the processor system 108a, while the normal system operations run at a higher clock rate, to have no substantial impact on overall system performance. The delay multiplex data is generated in steps that range from 4 to 100 steps to obtain a range of pass values. According to an embodiment of the invention, the delay multiplexed data is generated in 16 steps to obtain a range of pass values.

Figure 2B:
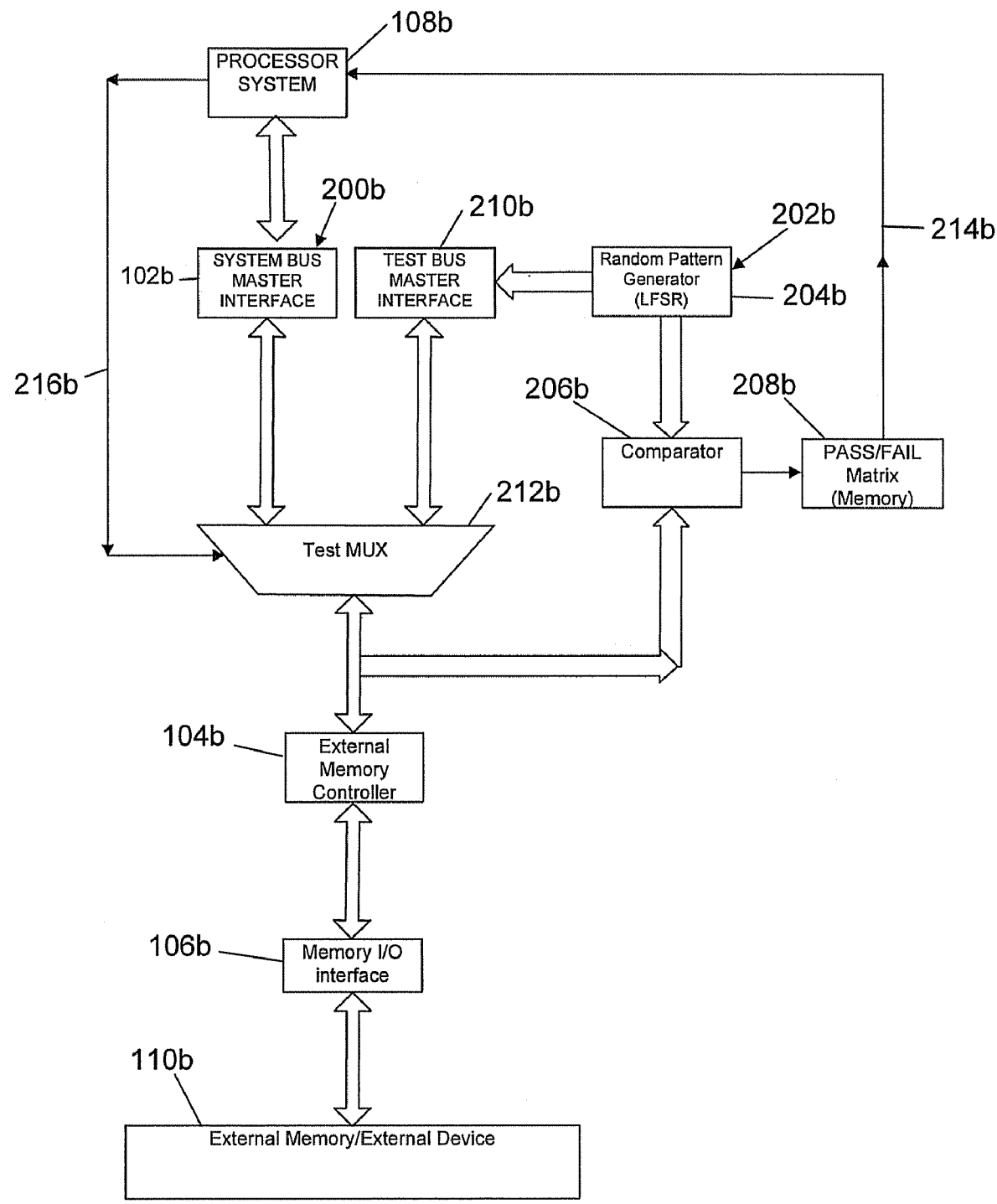
FIG. 2B is a diagram of a variation of the interface of FIG. 2A that includes a test mux and a calibration circuit for calibrating write and/or read-back clock and data exchanges between dies of an external memory/external device.

FIG. 2B discloses another variation of an interface, a processor system-to-device interface apparatus, indicated at 200b. The interface 200b has a test mux 212b, which is a variation of the master arbiter 212a of FIG. 2A, and which operates to halt the normal systems operation, and to generate the calibration test while normal systems operation is halted. Accordingly, the text mux 212b is set to halt the normal systems operation. The text mux 212b interfaces with the calibration circuit 202b via the test bus master interface 210b, and runs a test data algorithm of the processor system 108b, by which the calibration circuit 202b generates the calibration test, and transmits the set of sequenced, known stepped-through delays to the external memory/external device 110b at the memory I/O interface 106b. Running the calibration test at certain events and/or times, including, but not limited to initialization of the external memory/external device 110b, system start-up, system down-time or upon detection of a preset change in atmospheric and/or other operating conditions, such as, a low atmospheric temperature, which could cause an unexpected interruption of a normal system operation.

In FIG. 2B, a calibration circuit 202b is similar to the calibration circuit 202a in FIG. 2A. The calibration circuit 202b includes a random pattern generator that can include a (LSFR) 204b, a comparator 206b and a pass/fail matrix memory 208b With the normal system operation halted by the test mux 212b, the LSFR 204b generates a set of sequenced, known sequenced time delays corresponding to test data exchanges, and transmits resulting pass or fail test data to an external memory/external device 110b via a test bus master interface 210b and under control of the test mux 212b. Further, the LFSR 204b transmits a duplicated set of the test data to the comparator 206b, and is reset after successful transmission of the test data. For example, the reset is performed by the LSFR 204b resetting itself, or alternatively, by a reset control signal generated by the test mux 212b.

The test data provide pass or fail data for simulated write and read-back communications exchanged in the clock paths between the dies of the external memory/external device 11 b. Either successful simulated communication exchanges (pass data), or unsuccessful simulated communication exchanges (fail data), result from the multiplexed time delays. The pass/fail data are obtained for each of the respective dies of the external memory/external device 110b. The test mux 212b retrieves the pass/fail data output from the external memory controller 104b, and transmits the pass/fail data to the comparator 206b via the test bus master interface 210b, to match the pass/fail data with the corresponding test data that were duplicated and transmitted by the LSFR 204b to the comparator 206b. The pass/fail data matched with corresponding test data are output from the comparator 206b for storage in the pass/fail matrix memory 208b.

With further reference to FIG. 2B, the processor system 108b retrieves the stored data (the pass/fail data matched with corresponding test data) from the pass/fail matrix memory 208b. The retrieved data is routed over the communications line 214b from the pass/fail matrix memory 208b. The processor system 108b applies an analysis algorithm to the retrieved data to identify the timing delays that correspond solely to pass data that are present in the pass/fail data.

Moreover, the analysis algorithm applies a selection formula that selects calibration values from the timing delays that correspond to the pass data. The processor system 108b outputs the calibration values over the transmission line 21 6b to the test mux 212b. Alternatively, the processor system 108b can output the calibration values via the system bus master interface 102b to the test mux 212b. The test mux 212b calibrates the dies of the external memory/external device 110b with the calibration values, for successful transmission of communications to be exchanged between the dies during normal system operation.

Advantageously, selecting calibration values that occur within a range of pass values compensates for a loss of pass values due to operational drift in the equipment and/or external environmental changes including, but not limited to atmospheric conditions or RF interference. This will allow the memory access to work reliably even when operating parameters such as ambient temperature and applied voltage vary within the range of the timing window after calibration is performed. The analysis algorithm can be set to determine a range of pass values, and to select a calibration value that corresponds to any pass value in the range. Most preferably, the analysis algorithm can be set to determine a range of pass values, and to select a calibration value occurring substantially at a midpoint range of the pass values. For another embodiment of the invention, the analysis algorithm can be set to select calibration values that correspond to any of the pass data in the pass/fail data.

Figure 3:
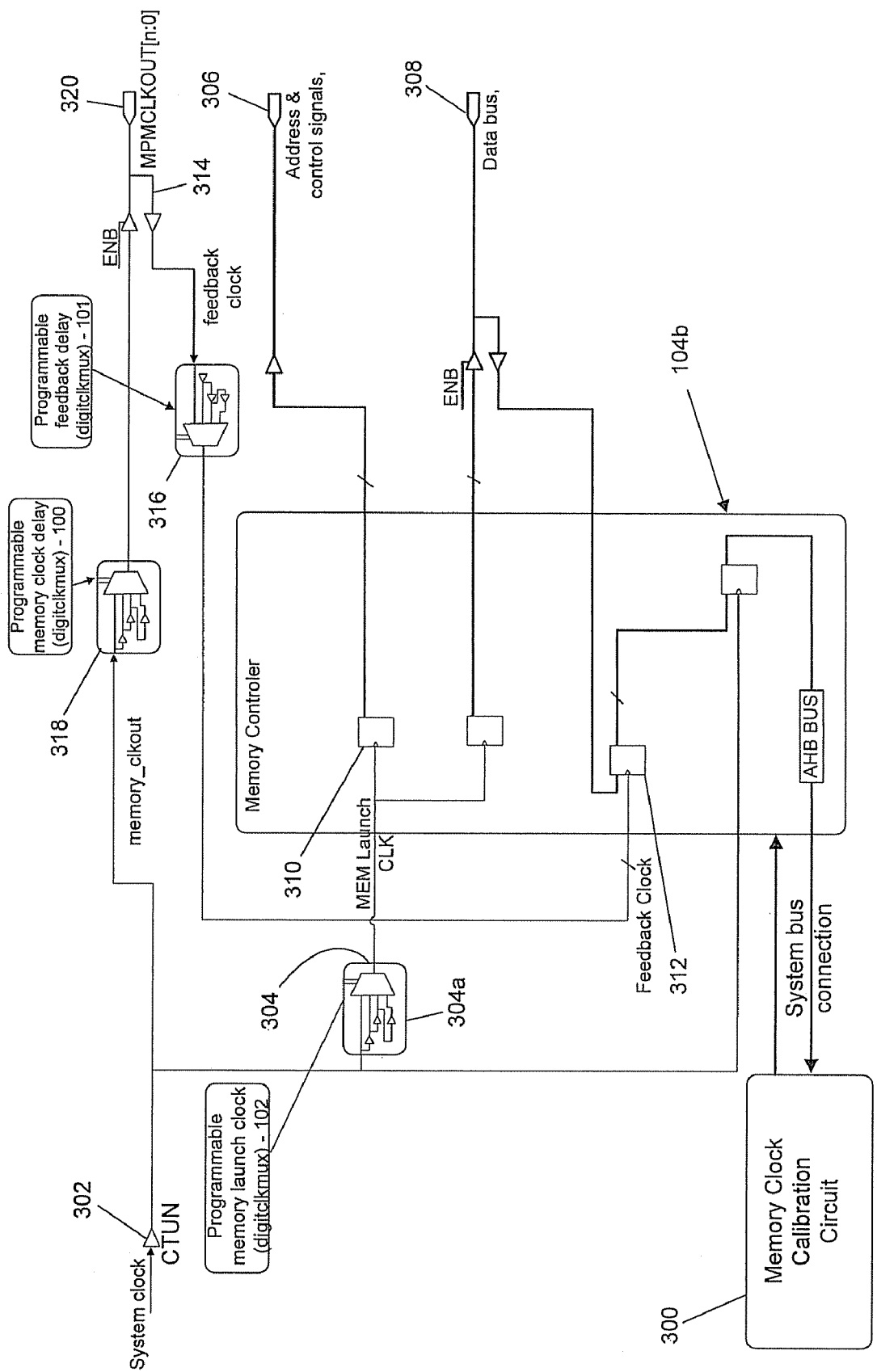
FIG. 3 is a circuit diagram of an external memory controller.

A typical external memory controller 104b disclosed in FIG. 2B is further described with reference to FIG. 3. In FIG. 3, a system clock 302 drives a first programmable device clock 304 that controls the timing of a launch clock signal (MEM Launch CLK) or (MemClk) for driving the external memory/external device 110b disclosed in FIG. 2B. With continued reference to FIG. 3, address and controls signals are received from an Address and Control Signals bus 306, and are sampled by the programmable device clock 304. Further, at the external device controller 104C, multiplexed "write" data are received from a Data bus 308, and are sampled at 310 by the device clock 304. Further, in FIG. 3, read-back signals are read-back from the Data bus 308, and are sampled at 312 by a programmable feedback clock 314.

With continued reference to FIG. 3, the system clock 302 drives a (write) delay multiplexer block 304a, as provided by the multiplexer 200b disclosed by FIG. 2B, that controls the timing of the programmable device clock 304.

Another (read-back) delay multiplexer block 316, as provided by the multiplexer 200b disclosed by FIG. 2B, controls the timing of the programmable read-back clock 314. The timing of the read-back clock 314 synchronizes the read-back data.

Another (data hold) delay multiplexer block 318, as provided by the multiplexer 200b disclosed by FIG. 2B, controls the duration of a data holding time of sufficient duration to ensure capture of the write and read-back data before a clock out 320 finishes and resets the calibration routines.

With continued reference to FIG. 3, the memory clock calibration circuit 300 is activated by the test mux 212b to write a block of test data to the dies of the external memory/external device 110b via the external memory controller 104b, using the generated test data. The block of test data written by the multiplexer block 304a is used to shift the timing of the programmable device clock 304 to control timing of "write" operations. The block of test data written by the multiplexer block 316 is used to shift the timing of the read-back clock 314 to control timing of read-back operations. The block of test data written by the multiplexer block 318 is used to shift the duration of the data holding time to ensure capture of the read-back data.

Figure 4:
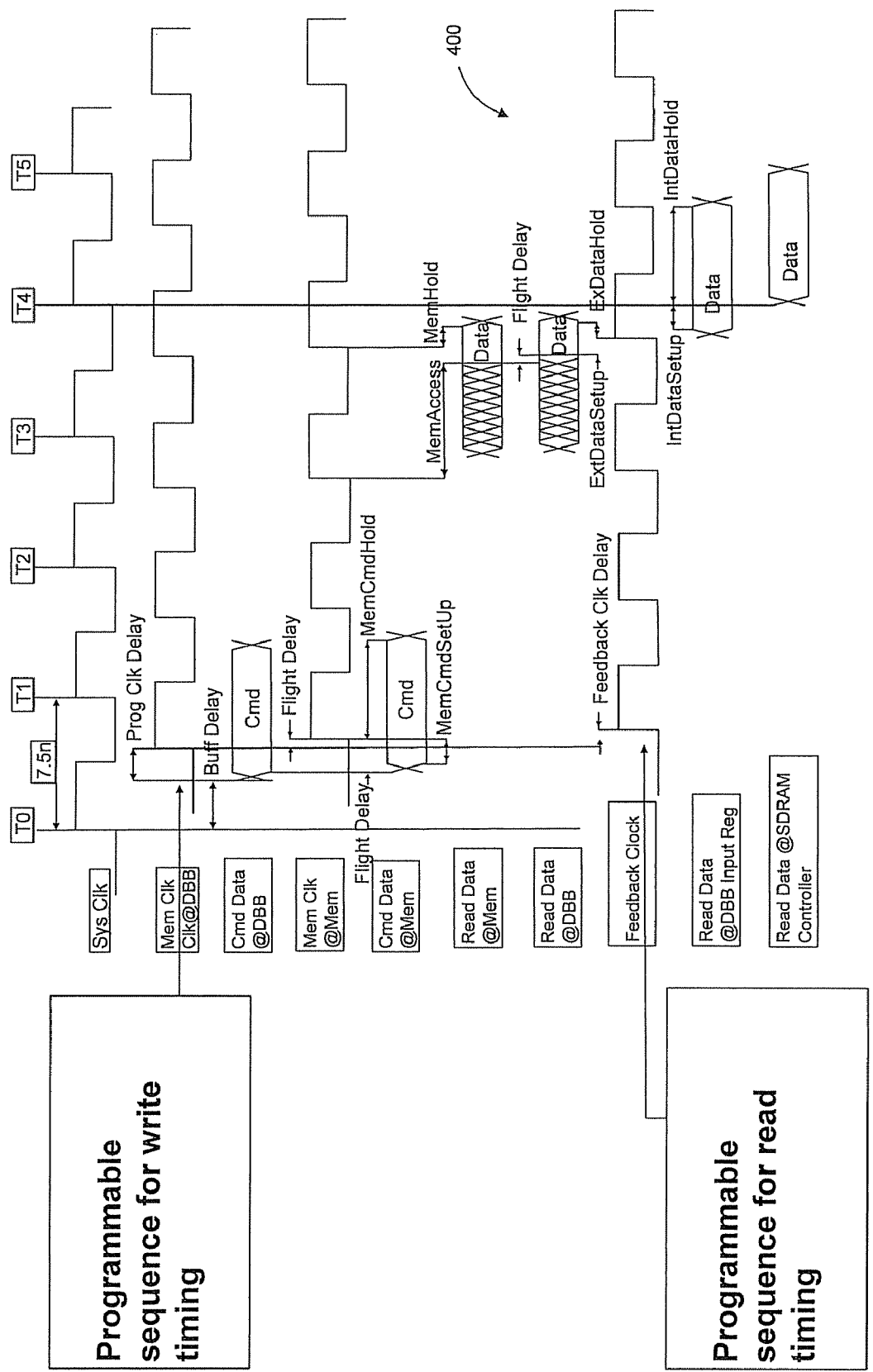
FIG. 4 is a timing diagram of read/write signals for timing calibration.

FIG. 4 is a timing diagram 400 of a sequence of clock-timed read/write signals indicating delay sources available for re-timing by fine tuning calibration of the clock timing. The following sequence of "write" clock timing delays that accumulate from system clock (Sys Clk) timing will now be described. The memory clock at DBB (Mem Clk @ DBB) and the command data at DBB (Cmd Data @ DBB) have a buffer delay (Buff Delay). Further, the memory clock at DB (Mem Clk @t DBB), has a programmed clock delay (Prog Clk Delay). Further, the memory clock at the memory (Mem Clk @ Mem) is offset from the memory clock at DBB (Mem Clk @t DBB) by a flight delay (Flight Delay).

Further in FIG. 4, "write" clock timing delays that accumulate from system clock (Sys Clk) timing will now be described. The command data at the memory (Cmd Data @ Mem) is subject to a flight delay (Flight Delay) that includes a memory command hold (MemCmdHold) from the command data at DBB (Cmd DataA @ DBB), and is subject to a memory command set-up delay (MemCmdSetUp).

With reference to FIG. 4, the "read-back" and "write" clock timing delays are desired to be tuned to obtain optimum timing performance for each clock path, by calibrating the timing performance to the center of a range of successful timing performances. Without such tuning, even a slight shift in the permissible range caused by semiconductor processing variations, ambient atmospheric temperature and applied voltage disturbances would cause a performance failure. The following procedure will optimize the settings of the three multiplexer blocks 304a, 316 and 318. First, some setting must be located wherein the memory test will pass (not fail). The settings are already in place when the device to be tested is in an operational mode with no failure in clock timing. Otherwise, there are several independent variables to adjust (3 in the example implementation). Finding the correct settings can always be solved by stepping through, i.e., permutating, all delay values for all variables.

Step 1. Starting with (0, 0, 0) settings for the multiplexer blocks 304a, 316 and 318 and permutating the settings through (0, 0, 1), and thereafter, determine which permutation determines a pass (not fail) state. If the test passes, move to step 2, below.

Step 2. Once a setting is determined, wherein the memory test passes, the optimization can begin. Assume that such a passing setting (x, y, z) produces a passing memory test, each variable, in turn, is tested to determine the limits of a range of permissible performance wherein the memory test will pass.

In the example, permutations of settings: (x+1, y, z), (x+1, y, z) and thereafter, are tested until a failure is found, which determines the upper limit in a range of permissible performance. Similarly, permutations of settings: (x−1, y, z), (x−1, y, z) and thereafter, are tested until a failure is found, which determines the lower limit in a range of permissible performance. The optimum setting for the "x" setting of the clock multiplexer comprises the center or midpoint of the range of permissible performances. For example, if the memory test passes with the "x" values of 3 through 7, the optimum value of the "x" setting is (3+7)(1/2)=5.

Step 3. In step 3 the process of Step 2 is repeated for each additional clock multiplexer setting, such as, the settings "y" and "z" in the example, passing setting (x, y, z). Thus, memory test passes for each the settings of "y" and "z" are obtained, which determine the range of permissible performances and the optimum setting at the center or midpoint of the range.

Step 4. When the algorithm is performed at the initial configuration of a device being tested, the optimum setting is saved for future use, for example, in a non-volatile memory block of the device 110 or 11b, or in a non-volatile memory block of the processor system 108a or 108b. Alternatively, the algorithm is real-time performed, for example, when the device is booting or changing supply voltage levels for low power operating mode, or after new software or updates or initialization of hardware (battery or flash memory) changes, and is immediately programmed into the device or software application for immediate use.

Figure 5:
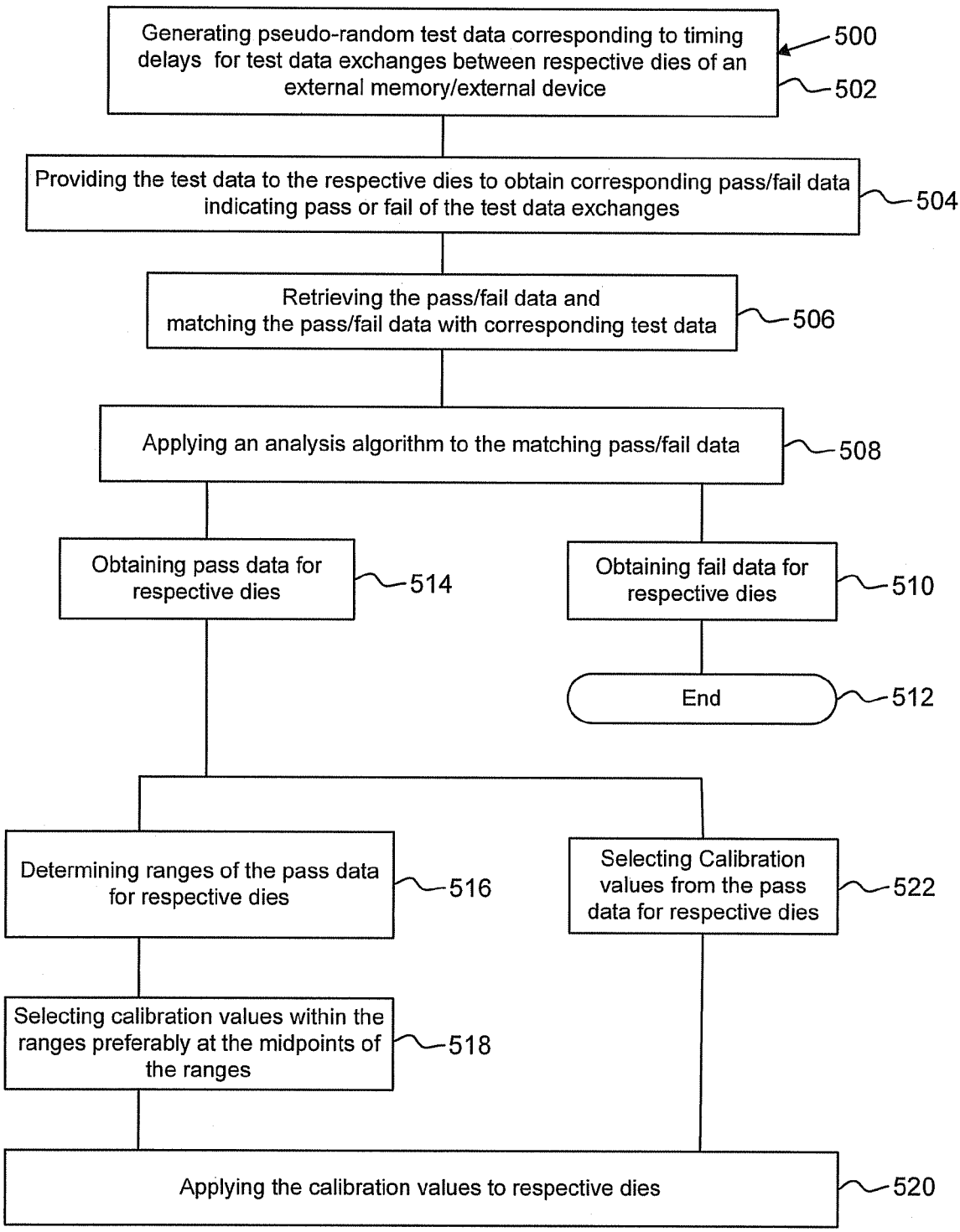
FIG. 5 is a flow diagram of a calibration process performed by the embodiments disclosed by FIGS. 2A and 2B.

FIG. 5 is a flow diagram 500 disclosing a method for timing calibration of write and read-back clock paths between respective dies of an external memory/external device, for example, the device 110a or 110b. The method is performed by the calibration circuit 200a or 200b.

Block 502 discloses a method step of generating a set of sequenced, known time delays corresponding to timing delays for test data exchanges between the respective dies of an external memory/external device. The time delays are generated by the random pattern generator LFSR 202a or 202b.

Block 504 discloses a method step of providing the test data to the respective dies to obtain corresponding pass/fail data indicating pass or fail of the test data exchanges. The master arbiter 212a or the test mux 212b provides the test data to the respective dies via the external memory controller 104a or 104b.

Block 506 discloses the method step of retrieving the pass/fail data, and matching the pass/fail data with corresponding test data. The master arbiter 212a or the test mux 212b retrieves the pass/fail data and matches the pass/fail data with corresponding test data in the comparator 206a or 206b. The matching pass/fail data is stored in the pass/fail matrix (memory) 208a or 208b.

Block 508 discloses the method step of applying an analysis algorithm to the matching pass/fail data. The processor system 108a or 108b applies the analysis algorithm to the matching pass/fail data outputted from the pass/fail matrix (memory) 208a or 208b.

Block 510 discloses a method step of obtaining fail data for respective dies. The processor system 108a or 108b applies the analysis algorithm to the matching pass/fail data to obtain the fail data for respective dies. Block 512 discloses an end to further processing of the fail data.

Block 514 discloses the method step of obtaining pass data for respective dies. The processor system 108a or 108b applies the analysis algorithm to the matching pass/fail data to obtain the pass data for respective dies.

Block 516 discloses the method step of determining ranges of the pass data for respective dies. The processor system 108a or 108b applies the analysis algorithm to the matching pass/fail data to obtain the pass data for respective dies and to determine the ranges of the pass data for respective dies.

Block 518 discloses the method step of selecting calibration values within the ranges, and preferably at the midpoints of the ranges. The processor system 108a or 108b applies the analysis algorithm to the matching pass/fail data, under control of the master arbiter 212a or the test mux 212b, to obtain the pass data for respective dies, to determine the ranges of the pass data for respective dies and to select the calibration values within the ranges, and preferably at the midpoints of the ranges.

Block 520 discloses the method step of applying the calibration values to respective dies. Thereby, the external memory/external device 110b is calibrated with the calibration values within the ranges of the pass data for respective dies, and preferably at the midpoints of the ranges. The processor system 108a or 108b applies the calibration values to respective dies under control of the master arbiter 212a or the test mux 212b.

Block 522 discloses an alternative method step of selecting calibration values from the pass data for respective dies, which pass data were obtained by the method step disclosed by block 514. The processor system 108a or 108b applies the analysis algorithm to the matching pass/fail data, under control of the master arbiter 212a or the test mux 212b, to obtain the pass data for respective dies. Block 520 discloses the method step of applying the calibration values to respective dies. Thereby, the external memory/external device 110b is calibrated with the calibration values selected from the pass data for respective dies.

When the algorithm is performed at the initial configuration of a device being tested, the optimum setting is saved for future use, for example, in a non-volatile memory block of the device 110a or 110b, or in a non-volatile memory block of the processor system 108a or 108b. Alternatively, the algorithm is real-time performed, for example, when the device is booting or changing supply voltage levels for low power operating mode, or after new software or updates or initialization of hardware (battery or flash memory) changes, and is immediately programmed into the device or software application for immediate use.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. Apparatus for timing calibration of write and read-back data exchanges between respective dies of an external memory/external device, comprising:
    a master arbiter between a system bus master interface and an external memory controller for driving the external memory/external device;
    a calibration circuit interfacing with the master arbiter via a test bus master interface, wherein the calibration circuit provides a set of sequenced, known stepped-through time delays for test data exchanges between the dies, and the calibration circuit obtains pass/fail data indicating pass or fail of the test data exchanges; and
    a processor system at the system bus master interface selecting calibration values corresponding to pass data, and applying the calibration values to the respective dies under control of the master arbiter for timing of write and read-back data exchanges between the dies.

2. The apparatus of claim 1, wherein the master arbiter runs the calibration circuit concurrently with operation of the processor system.

3. The apparatus of claim 1, wherein a random pattern generator of the calibration circuit provides the time delays.

4. The apparatus of claim 1, wherein the calibrated time delays correspond to midpoints of corresponding ranges of the pass data.

5. The apparatus of claim 1, comprising:
    a multiplexer controlled by the master arbiter to provide the semiconductor device with the test data, wherein the calibration circuit provides the time delays.

6. The apparatus of claim 1 wherein each of the write and read-back clocks is calibrated with a mid-range time delay within the range of time delays corresponding to successful transmission of the communications.

7. The apparatus of claim 1, comprising:
    a comparator for comparing read-back data with the test data to verify whether the test data were written and read-back correctly.

8. The apparatus of claim 1, comprising:
    a device I/O interface between the external device controller and the semiconductor device.

9. The apparatus of claim 1, comprising:
    a test mux serving as the master arbiter, wherein the test mux halts operation by the processor system and runs the multiplexer operation while halting operation of the apparatus by the processor system.

10. The apparatus of claim 1, wherein the master arbiter runs the calibration circuit concurrently with operation of the processor system and at a lower rate than a clock rate of the processor system.

11. The apparatus of claim 10, wherein the processor system operates at a clock rate suitable for voice and/or data transmission.

12. The apparatus of claim 1, wherein the processor system operates at a clock rate suitable for voice and/or data transmission.

13. A method for timing calibration of write and read-back data exchanges between respective dies of an external memory/external device, comprising:
    generating a set of sequenced, known stepped-through time delays corresponding to timing delays of test data exchanges between the respective dies;
    providing the test data to the respective dies to obtain corresponding pass/fail data indicating pass or fail of the test data exchanges;
    retrieving the pass/fail data, and matching the pass/fail data with corresponding test data;
    applying an analysis algorithm to the matching pass/fail data;
    obtaining pass data for respective dies;
    selecting calibration values from the pass data for respective dies; and
    applying the calibration values to respective dies, wherein the external memory/external device is calibrated with the calibration values selected from the pass data.

14. The method of claim 13, comprising:
    determining ranges of the pass data for respective dies;
    selecting the midpoints of the ranges of the pass data to serve as calibration values; and
    applying the calibration values to respective dies, wherein the external memory/external device is calibrated with the calibration values selected at midpoints of the ranges of the pass data.

15. The method of claim 13, comprising:
    determining ranges of the pass data for respective dies;
    selecting the calibration values within the ranges of the pass data; and
    applying the calibration values to respective dies, wherein the external memory/external device is calibrated with the calibration values selected within the ranges of the pass data.

16. The method of claim 13 wherein generating the test data and providing the test data to the respective dies is performed while halting operation of the apparatus by the processor system.

17. The method of claim 13 wherein generating the test data and providing the test data to the respective dies is performed concurrently with operation of the apparatus by the processor system and at a lower rate than a clock rate of the processor system.

18. The method of claim 17, comprising:
    operating the processor system at a clock suitable for voice and/or data transmission.

19. The method of claim 13, comprising:
    operating the processor system at a clock rate suitable for voice and/or data transmission.

* * * * *

UNITED STATES PATENT AND TRADEMARK OFFICE
CERTIFICATE OF CORRECTION

| | |
|---|---|
| PATENT NO. | : 7,818,135 B2 |
| APPLICATION NO. | : 12/129882 |
| DATED | : October 19, 2010 |
| INVENTOR(S) | : Ravi Kishore Jammula et al. |

It is certified that error appears in the above-identified patent and that said Letters Patent is hereby corrected as shown below:

On the cover page, in the Abstract, line 4, please replace "a test bus" with --a test mux--.

Signed and Sealed this
First Day of February, 2011

David J. Kappos
*Director of the United States Patent and Trademark Office*